United States Patent
Ito et al.

(10) Patent No.: US 6,530,066 B1
(45) Date of Patent: Mar. 4, 2003

(54) METHOD OF COMPUTING WIRING CAPACITANCE, METHOD OF COMPUTING SIGNAL PROPAGATION DELAY DUE TO CROSS TALK AND COMPUTER-READABLE RECORDING MEDIUM STORING SUCH COMPUTED DATA

(75) Inventors: Yuko Ito, Hamura (JP); Satoru Isomura, Hamura (JP)

(73) Assignee: Hitachi, Ltd., Tokyo (JP)

( * ) Notice: Subject to any disclaimer, the term of this patent is extended or adjusted under 35 U.S.C. 154(b) by 168 days.

(21) Appl. No.: 09/666,863

(22) Filed: Sep. 21, 2000

(30) Foreign Application Priority Data

Sep. 22, 1999 (JP) .......................................... 11-268734

(51) Int. Cl.$^7$ .......................... G06F 17/50; H01L 21/22
(52) U.S. Cl. ..................... 716/5; 716/6; 716/8; 716/19; 438/599; 703/15
(58) Field of Search .............................................. 716/5

(56) References Cited

U.S. PATENT DOCUMENTS

| | | | | |
|---|---|---|---|---|
| 5,322,438 A | * | 6/1994 | McNutt et al. ................. | 716/8 |
| 5,359,534 A | * | 10/1994 | Fujiki et al. .................... | 716/6 |
| 5,414,636 A | * | 5/1995 | Ema .............................. | 716/19 |
| 5,446,674 A | * | 8/1995 | Ikeda et al. ..................... | 716/5 |
| 5,452,224 A | * | 9/1995 | Smith, Jr. et al. ............. | 716/19 |
| 5,459,093 A | * | 10/1995 | Kuroda et al. ............... | 438/599 |
| 5,761,080 A | * | 6/1998 | DeCamp et al. ................ | 716/5 |
| 5,831,870 A | * | 11/1998 | Folta et al. ..................... | 716/5 |
| 5,838,582 A | * | 11/1998 | Mehrotra et al. ............... | 716/5 |
| 5,896,300 A | * | 4/1999 | Raghavan et al. ............. | 703/15 |
| 6,253,359 B1 | * | 6/2001 | Cano et al. ..................... | 716/5 |
| 6,374,391 B1 | * | 4/2002 | Yamada ......................... | 716/5 |

FOREIGN PATENT DOCUMENTS

JP         9-147009         6/1997

* cited by examiner

*Primary Examiner*—Matthew Smith
*Assistant Examiner*—Andrea Liu
(74) *Attorney, Agent, or Firm*—Mattingly, Stanger & Malur, P.C.

(57) ABSTRACT

The present invention is to provide a method of computing wiring capacitance to be able to get parasitic capacity depending on the wiring at high speed and with great accuracy, and to provide a method of computing signal propagation delay due to cross talk to be able to remove surplus margins at high speed when delay is predicted. In design of LSIs such as microprocessors or the like, total capacity Ctotal per unit length is determined about each of a plurality of models altering adjacent wiring ((a) no adjacent wiring, (b) one-side adjacent wiring, and (c) both-sides adjacent wiring) and/or crossing ratios ((i) 0%, (ii) 33%, (iii) 67%, and (iv) 100%) and, thereby, a library is formed from these to design the LSI. Regarding characteristic of this total capacity per unit length, the capacity depending on increase of the crossing ratio has a high increase rate in an area of a low crossing ratio, while the capacity depending on increase of the crossing ratio has the low increase rate in high crossing ratio. Regarding a case of no adjacent wiring, the capacity depending on increase of crossing ratio has a high increase rate in comparison to a case of one-side or both-sides adjacent wiring.

3 Claims, 14 Drawing Sheets

FIG.4(iii)
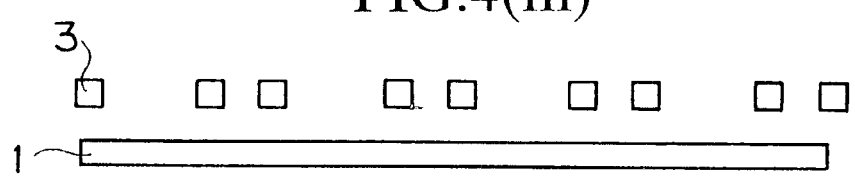

|  |  | \multicolumn{4}{c}{crossing ratio} |
| --- | --- | --- | --- | --- | --- |
|  |  | 0% | 33% | 67% | 100% |
| parallel ratio | 0% no adjacency | (a-i) | (a-ii) | (a-iii) | (a-iv) |
|  | 100% one-side adjacency | (b-i) | (b-ii) | (b-iii) | (b-iv) |
|  | 200% both-sides adjacency | (c-i) | (c-ii) | (c-iii) | (c-iv) |

METHOD OF COMPUTING WIRING CAPACITANCE, METHOD OF COMPUTING SIGNAL PROPAGATION DELAY DUE TO CROSS TALK AND COMPUTER-READABLE RECORDING MEDIUM STORING SUCH COMPUTED DATA

BACKGROUND OF THE INVENTION

This invention generally relates to a technique of computing the signal propagation delay in an LSI device and, more particularly, it relates to a technique that can effectively apply to a method of computing wiring capacitance and of computing cross talk delay that can get parasitic capacity depending on wiring at high speed and with great accuracy and that is capable of removing surplus margin at the time of delay prediction.

For example, as a technique that the present inventors have considered, when the signal propagation delay in a LSI designed is computed, it is necessary to determine the load capacity of the wiring of the LSI. Following methods are considered as methods of computing this wiring capacitance;

(a) A method of preparing a library of average capacity values per unit length, the values corresponding to width and wiring layer of the noted wiring, getting the length of the noted wiring from a netlist, and multiplying both capacity value per unit length and the length of the noted wiring to computing the noted wiring capacitance.

(b) A method of preparing a library of capacity values (Cbase) per unit length, the values corresponding to width and wiring layer of the noted wiring when the noted wiring is used alone, increments (ΔCpara) of capacity values of the noted wiring where there exists parallel wiring, and increments (ΔCcross) of capacity values of the noted wiring where there exists cross wiring, and getting the length of the noted wiring the lengths of the parallel wiring, and both width and number of the noted wiring from the netlist to compute the capacity of the noted wiring capacitance.

(c) A method of performing capacity simulation of the noted wiring per net.

As a method of computing the cross talk delay, for example, the Japanese Patent Application Laid-Open No. 9-147009 describes a technique of computing the signal propagation delay due cross talk. Briefly, it is a technique of determining the fluctuations in the signal propagation delay due to cross talk by referring to a function table expressing power of driving the gate (source impedance) and the locations and parallel lengths of the parallel wiring in order to predict the delay with great accuracy.

Thus, from a consequence of the inventors considering the above-mentioned computing methods of wiring capacitance, the following is apparent. As corresponding to the following, a problem about each method of said (a) and (b) will be explained.

(a) The fluctuations of the signal propagation delay cannot be expressed because the parasitic capacity is changed by high and low density resulting from arrangement of both adjacent wiring and upper-lower layer wiring. This prevents the computing of the delay form being performed with great accuracy.

(b) The values of Cbase, ΔCpara and ΔCcross have such a mutually depending relationship that values of Δcpara are different in high and low density of cross ratio of the cross wiring and those of Δccross are different in depending on whether the adjacent wiring exists or not. Thereby, the values of Cbase, ΔCpara and Δccross are very different from each other in selecting a model when the computing of the wiring capacitance is performed. Additionally, since this defines values of the selected model, the computed capacity values have a limit in accuracy.

(c) The operation of determining the capacity value by capacity simulation requires long time and a large memory capacity. Therefore, it is practically impossible to determine it within the period of real time that can be allowed for verifying the delay on the basis of the entire net. While methods for determining the capacity value at high speed by means of pseudo three-dimensional simulation are also used, such methods indispensably require a screening process of limiting critical paths before using them for the computation and hence cannot correspond to all the paths.

Therefore, an object of the present invention is to provide a method of computing at high speed and with great accuracy the parasitic capacity of an LSI device due to its wiring by particularly paying attention to the change in the parasitic capacity depending on high and low density of arrangement of both adjacent wiring and the upper-lower layer wiring, and is to provide a computer-readable recording medium storing the data necessary in the form of a library.

Additionally, the following is apparent about the method of computing the cross talk delay as mentioned above. That is, the operation of generating the fluctuations of the signal propagation delay as defined by the function table is limited only when the signal of a generated side is made operational within a predetermined period of time before and after the expected operating time of the signal of an affected side. However, the above described methods do not take this timing problem into consideration so that they inevitably involve the use of a surplus margin. Then, in order to reach a target of speed, power is raised to an unnecessary extent or the target speed is lowered and this consequently causes the performance of the LSI device to be lowered.

Thus, another object of the present invention is to provide a method of computing the delay due to cross talk by paying attention only to the cross talk noise that can give rise to fluctuations in the signal propagation delay so that the surplus margin may be eliminated when the delay is predicted. Still another object of the present invention is to provide a computer-readable recording medium storing the data in the form of a library.

The above-mentioned objects and other objects of the present invention as well as the novel features of the present invention will become apparent by reading the detailed description of the invention that follows below and also by referring to the accompanied drawings.

SUMMARY OF THE INVENTION

The characteristic aspects of the present invention can be summarized as follows.

According to the invention, there is provided a method of computing wiring capacitance of an LSI device comprising a step of determining parasitic capacity of the wiring of noted net from width and number of wires of other nets crossing the noted wiring of the net and the span of the wiring of other nets in the same layer and the upper and lower layers running in parallel with (adjacently relative to) the wiring of the noted net; said method being characterized in that the parasitic capacity of the wiring of the LSI device is determined on the basis of the wiring density of other nets existing around the wiring of noted net.

Preferably, in a method of computing wiring capacitance of an LSI device according to the invention, a table of wiring capacitance per unit length is generated as library in terms of the ratio of the wiring of upper-lower layers crossing wiring of the noted net (crossing ratio) relative to the length of the latter and that of the wiring of the same layer and the upper-lower layers running in parallel with the wiring of the noted net in order to determine the parasitic capacity of wiring within the LSI device.

Alternatively, in a method of computing wiring capacity of an LSI device according to the invention, a function of wiring capacitance per unit length is generated as library in terms of the ratio of wiring of upper-lower layers crossing wiring of noted net (crossing ratio) and that of the wiring of same layer and upper-lower layers running in parallel with the wiring of the noted net in order to determine the parasitic capacity of the wiring within the LSI device.

Then, the wiring of noted net is treated as a plurality of segments produced by dividing it on a via by via basis and the capacity of each segment is determined from the length of the segment, the span of the wiring of other nets in same layer and upper-lower layers running adjacently relative to the wiring and the value of width×number of wiring crossing the wiring.

According to the invention, there is also provided a computer-readable recording medium storing data for a method of computing wiring capacity of an LSI device as defined above.

In an aspect of the invention, there is provided a method of computing the signal propagation delay due to cross talk of an LSI device comprising: a step of determining range of variation of the delay produced by the operating time of the signal of noted net and the cross talk noise; a step of determining the operating time of the signal of each net in the layer of the noted net, in the upper layer and in the lower having its wiring running in parallel with the wiring of the noted net and identifying the net having the range of fluctuation of the delay overlapping said range as noise source; a step of determining the variation of the delay from the table of variations of delay due to cross talk prepared in advance for the combination of the noted net and the net identified as noise source; and a step of adding the variation of the delay of the net identified as noise source to that of the delay of the noted net; said method being characterized by identifying the signal generating noise and operating within the range of variation of the delay due to cross talk and computationally determining the delay by considering only the variation of the delay due cross talk produced by the signal generating noise.

In a method of computing signal propagation delay due to cross talk, if a countermeasure allows a value of the delay about wiring of the noted net adding a value of fluctuation of net of the noise source, to attain an objective value, fluctuation of delay depending on the cross talk is prevented from occurring by means of at least one of modifications of wiring form about wiring of the noted net, modifications of form about net of the noise source, arrangement of shield wiring between wiring of the noted net and net of the noise source, and an insertion into gate to move outside range affected by fluctuation of the delay.

In a computer-readable recording medium storing data for the method of computing wiring capacitance, a library is formed from one of {combinations of a wiring layer and width between wiring of the noted net and wiring of other nets running in parallel therewith, and spaces between wiring and other wiring}, {combination of respective characteristics of wiring capacitance between wiring and other wiring running in parallel therewith, other capacity of non-noise signal wiring, other capacity of noise source signal wiring, resistance of non-noise signal wiring, and resistance of noise source signal source}, {location and parallel distance of parallel wiring}, and {combination of source impedance of both nets} in a table about value of fluctuation of the delay depending on the cross talk, and the data, representing the table in the library in a predetermined format, are stored.

Some remarkable advantages of the present invention include the following:

(1) According to a method of computing wiring capacitance of the present invention, the parasitic capacity depending on the wiring can be determine at high speed and with great accuracy, so that accuracy for computing the signal propagation time can be improved with great accuracy of computing the parasitic capacity.

(2) According to a method of computing the delay due to cross talk of the present invention, by means of taking into consideration only the cross talk noise causing really fluctuation of the delay, surplus margins can be removed at time of prediction of the delay, so that performance (operating speed) can be improved and consumption power can be reduced.

(3) As a result of (1) and (2) above, it is possible to improve the accuracy of computing the signal propagation time when designing a microprocessor, an ASIC or a high-speed LSI device by taking the signal propagation delay in the device into consideration in order to improve the performance and reduce the power consumption of the device.

BRIEF DESCRIPTIONS OF THE DRAWINGS

FIG. 1(*b*) shows a situation where an adjacent wiring exists.

FIG. 1(*c*) shows a situation where a crossing wiring in the upper layer exists.

FIG. 1(*d*) shows a situation where both adjacent wiring and crossing wiring in the upper layer exist.

FIG. 3(*b*) is a schematic cross sectional view (without hatching for representing cross section) of models of adjacent wiring running in parallel with the noted wiring.

FIG. 3(*c*) is a schematic cross sectional view (without hatching for representing cross section) of models of adjacent wiring running in parallel with the noted wiring.

FIG. 4(*ii*) is a schematic cross sectional view (without hatching for representing cross section) of a model of crossing wiring across the noted wiring.

FIG. 4(*iii*) is a schematic cross sectional view (without hatching for representing cross section) of a model of crossing wiring across the noted wiring.

FIG. 4(iv) is a schematic cross sectional view (without hatching for representing cross section) of a model of crossing wiring across the noted wiring.

DESCRIPTION OF THE PREFERRED EMBODIMENTS

Now, preferred embodiments of the present invention will be described below by referring to the accompanying drawings. An embodiment of method of computing a wiring capacitance according to the present invention will be described by referring to FIGS. 1(a) through 9. An embodiment of method of computing a signal propagation delay of a device will be described by referring to FIGS. 10 through 15.

Firstly, by referring to FIGS. 1(a) through 1(d), a schematic conceptual example of an embodiment of a method of computing wiring capacitance according to the present invention is illustrated. By the method of computing a wiring capacitance of an embodiment according to the present invention, when various LSIs, such as a microprocessor, an ASIC, or a high speed and integrated LSI, are designed, the capacitance per unit length is computed about whether the adjacent wirings exist or not therein and about a plurality of models changing the cross ratio of the cross wiring. The capacity per unit length of each of the models may be determined by simulation or by actually measuring it by means of a TEG (test element group).

An increasing rate of the capacity per unit length of the wiring due to the crossing ratio is high in an area of low crossing ratio while being low in an area of high crossing ratio. The increasing rate of the capacity per unit length due to the increase of the ratio of the crossing wiring is higher when there is no adjacent wiring than when there is at least one adjacent wiring. This is because electric field induced by the peripheral wiring fiercely fluctuates with dependence on increase or decrease of the peripheral wiring when density of the peripheral wiring is low. On the other hand, this is also because the electric field approaches a saturated state when density of the peripheral wiring is high. That is, this is because the electric field hardly fluctuates without dependence on increase or decrease of the peripheral wiring.

Figure 1A:
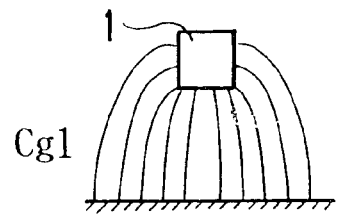
FIG. 1(*a*) is a schematic conceptual illustration of a case where there is wiring alone, where there is adjacent wiring, and where there is crossing wiring respectively about a method of computing wiring capacitance according to one embodiment of the present invention.
Figure 1B:
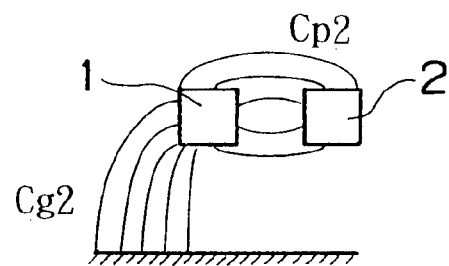
Figure 1C:
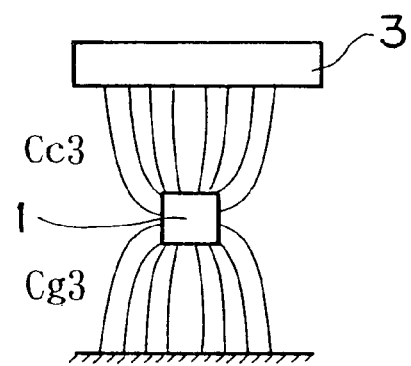
Figure 1D:
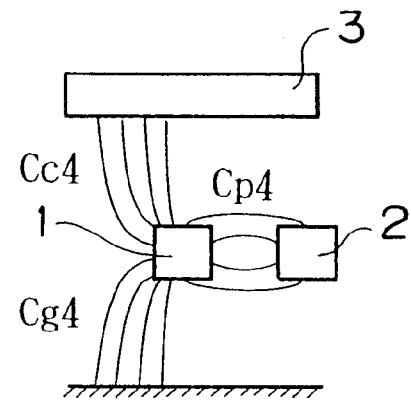

For example, in FIGS. 1(a) through 1(d), FIG. 1(a) shows a situation where a noted wiring is arranged alone, FIG. 1(b) shows a situation where a adjacent wiring 2 exists, FIG. 1(c) shows a situation where a crossing wiring 3 in the upper layer exists, and FIG. 1(d) shows a situation where both adjacent wiring 2 and crossing wiring 3 in the upper layer exist. When there is the adjacent wiring 2 of FIG. 1(b), since parallel capacity (Cp2) between the noted wiring 1 and the adjacent wiring 2 is added, total capacity (Cg2+Cp2) of FIG. 1(b) increases more than total capacity of FIG. 1(a). But, corresponding ground capacity between ground and the noted wiring 1 in FIG. 1(b) decreases less than that in FIG. 1(a). When there is crossing wiring 3 in the upper layer in FIG. 1(c), since crossing capacity (Cc3) between the noted wiring 1 and the crossing wiring 3 is added, total capacity (cg3+Cc3) of FIG. 1(c) increases more than that of FIG. 1(a). But, corresponding ground capacity on FIG. 1(c) decreases less than the corresponding ground capacity of FIG. 1(a). When there are both adjacent wiring 2 and crossing wiring 3 in the upper layer in FIG. 1(d), since crossing capacity (Cc4) between the noted wiring 1 and the crossing wiring 3 in FIG. 1(d) is added, total capacity (Cg4+cp4+Cc4) of FIG. 1(d) increases more than the total capacity of FIG. 1(b). But, the corresponding capacity and parallel capacity of FIG. 1(d) decrease less than those of FIG. 1(b). Additionally, since parallel capacity between the noted wiring 1 and the adjacent wiring 2 in FIG. 1(d) is added, the total capacity (Cg4+Cp4+Cc4) of FIG. 1(d) increases more than that of FIG. 1(c). But, both corresponding ground capacity and crossing capacity of FIG. 1(d) decrease less than those of FIG. 1(c).

Thus, the increment of capacity ($\Delta$Cp) depending on the adjacent wiring 2 can be determined by the difference between the capacity of FIG. 1(a) and FIG. 1(b), or $\Delta Cp2=(Cg2+Cp2)-Cg1$.

It can also be determined by the difference between the capacity of FIG. 1(c) and FIG. 1(d), or $\Delta Cp4=(Cg4+Cp4+Cc4)-(Cg3+Cc3)<\Delta Cp2$.

The $\Delta$Cp varies depending on whether there is nor not the crossing wiring 3 (crossing ratio). In other words, the $\Delta$Cp varies depending on the selected computation model.

On the other hand, the increment of capacity ($\Delta$Cc) depending on the crossing wiring 3 can be determined by the difference between the capacity of FIG. 1(a) and FIG. 1(d), or $\Delta Cc3=(Cg3+Cc3)-Cg1$.

It can also be determined by the difference between the capacity of FIG. 1(b) and FIG. 1(d), or $\Delta Cc4=(Cg4+Cp4+Cc4)-(Cg2+Cp2)<\Delta Cc3$.

The increment of capacity ($\Delta$Cc) varies depending on whether there is or not the adjacent wiring 2 (parallel ratio).

In other words, the ΔCc varies depending on the selected computation model.

The above relationships are summarized below.

$Cg1>Cg2>Cg4$, $Cg1>Cg3>Cg4$, $Cp2>Cp4$, $Cc3>Cc4$, $Cg1<(Cg2+Cp2)<(Cg4+Cp4+Cc4)$, $Cg1<(Cg3+Cc3)<(Cg4+Cp4+Cc4)$, $\Delta Cp2=(Cg2+Cp2)-Cg1$, $\Delta Cc3=(Cg3+Cc3)-Cg1$, $\Delta Cp4=(Cg4+Cp4+Cc4)-(Cg3+Cc3)<\Delta Cp2$, and $\Delta Cc4=(Cg4+Cp4+Cc4)-(Cg2+Cp2)<\Delta Cc3$.

Subsequently, Cbase, ΔCpara and ΔCcross are determined from the wiring capacitance that varies depending on whether the adjacent wiring 2 is not and on the crossing ratio of the crossing wiring as described above. When each of the Cbase, ΔCpara and Δccross is defined as a constant, value of the constant will be selected depending on the purpose of using them. For example, in order to make such a safety design that the value of the computed capacity is securely more than that of the real capacity, the ΔCcross is determined by using the gradient of an area where the adjacent wiring 2 is located on both sides and the crossing ratio is high, and the ΔCpara is determined from the difference between a situation where a pair of adjacent wiring 2 are located respectively at the opposite lateral sides and a situation where adjacent wiring 2 is located only at a lateral side. Then, Cbase is determined by computation using the obtained values. If it is desired to make density of the wiring accord with a standard value, the ΔCcross may be determined by using the gradient of an area which is near the objective wiring density. Alternatively, the presence or absence of the adjacent wiring 2 having the wiring capacitance as determined above and the dependency of the crossing ratio of the crossing wiring 3 may be defined in the form of a table or a function. In this case, as it is unnecessary to change a method of defining the Cbase, ΔCpara, and ΔCcross as corresponding to the above-mentioned objection, the capacity computation is accurately performed about every wiring capacitance.

Next, a method of computing wiring capacitance will in turn be described as an example of models the adjacent wiring 2 and the crossing wiring 3 concretely corresponding to the noted wiring 1.

(1) The wiring capacitance per unit length is determined about a model altering the presence or absence of the adjacent wiring 2 and/or the crossing ratio of the crossing wiring 3. For example, the models are considered a total of twelve varieties changing 0%, 33%, 67% or 100% in the crossing ratio respectively, about no adjacency, one-side adjacency or both-sides adjacency of wiring. The 100% crossing ratio means that the crossing wiring is arranged in the densest state every admitted wiring pitch. If a ratio of a line width to a space is 1:1, the 100% crossing ratio means that a ratio of a surface area occupied by the wiring is 50%.

Figure 2:
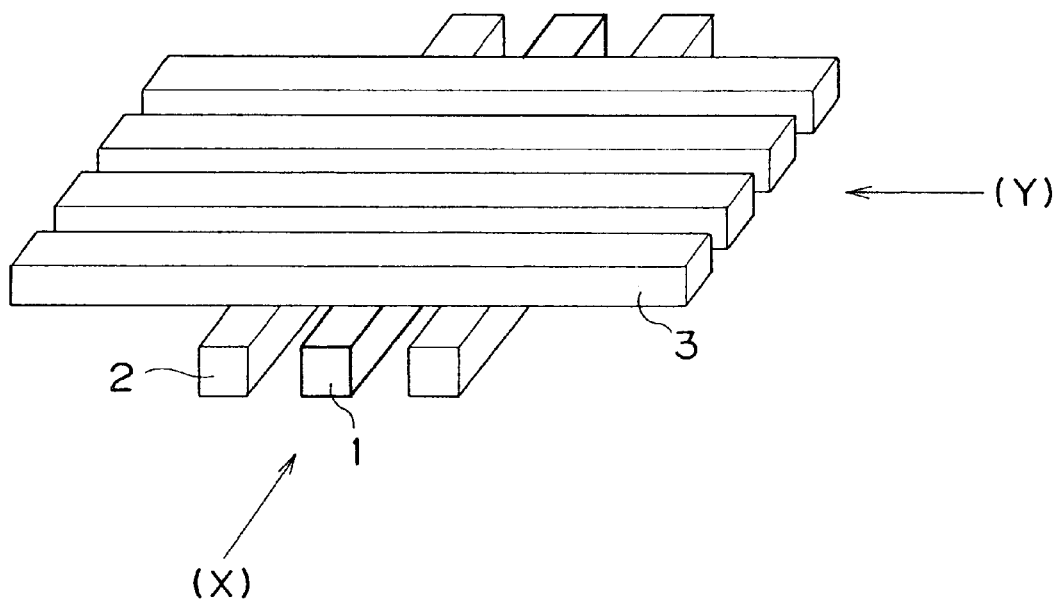
FIG. 2 is a schematic perspective view of a model including noted wiring, adjacent wiring running in parallel with the noted wiring, and crossing wiring across the noted wiring according to one embodiment of the present invention.
Figure 3A:
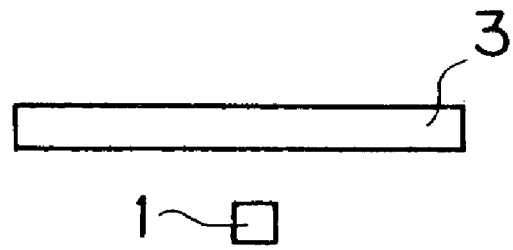
FIG. 3(*a*) is a schematic cross sectional view (without hatching for representing cross section) of models of adjacent wiring running in parallel with the noted wiring.
Figure 3B:
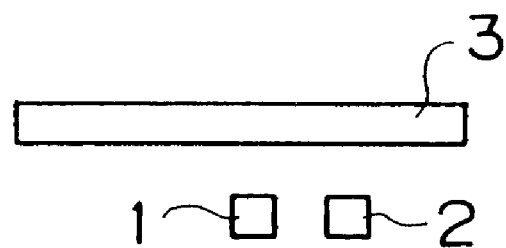
Figure 3C:
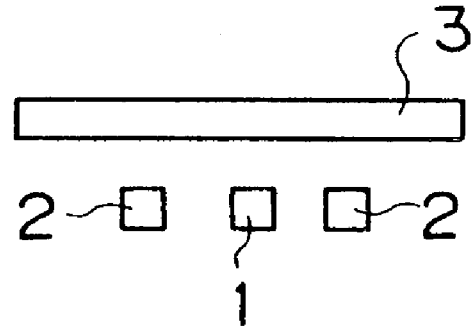
Figure 4I:
FIG. 4(*i*) is a schematic cross sectional view (without hatching for representing cross section) of a model of crossing wiring across the noted wiring.
Figure 4:
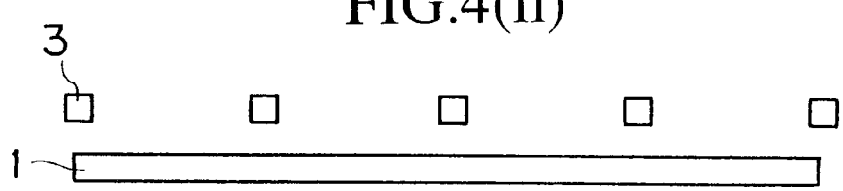
Figure 4:
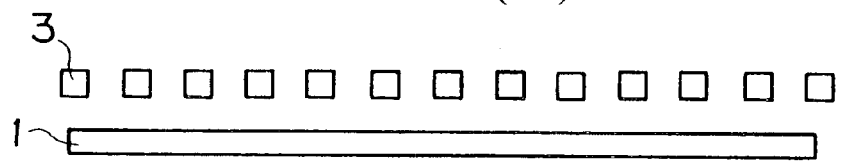

For example, FIG. 2 illustrates the adjacent wiring 2 and/or the crossing wiring 3 in an upper layer in relative to the noted wiring 1. In FIGS. 3(a) to 3(c) (viewed from (x) direction of FIG. 2), three kinds of no adjacent wiring of FIG. 3(a), one-side adjacent wiring of FIG. 3(b), and both-sides adjacent wiring of FIG. 3(c) are considered as a model altering number of the adjacent wiring 2. And, in FIGS. 4(i) to 4(iv) (viewed from (Y) direction of FIG. 2), four kinds of 0% of FIG. 4(i), 33% of FIG. 4(ii), 67% of FIG. 4(iii), and 100% of FIG. 4(iv) are thought as a model changing the crossing ratio of the upper-layer crossing wiring 3. Thus, the twelve kinds of model are proposed in combination with respective above-mentioned models.

(2) The ΔCcross is got from the gradient corresponding to the cross ration of the capacity value determined by the above-mentioned (1), and the Δcpara is got from the difference between the both-sides adjacent wiring and the one-side adjacent wiring, and, thereby, Cbase can be determined by using these values.

Figure 5B:
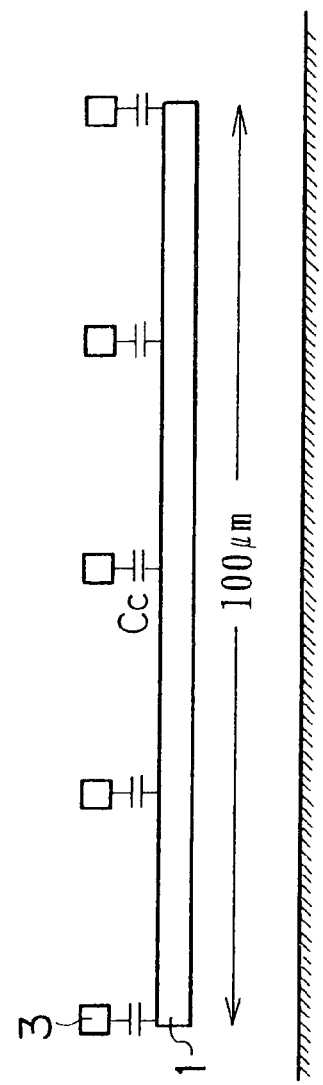
FIG. 5(b) is an explanatory view showing a method of computing capacity per unit length.
Figure 5A:
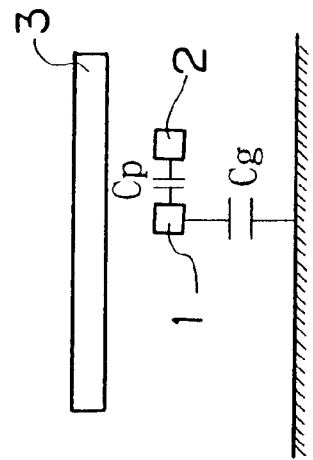
FIG. 5(a) is an explanatory view showing a method of computing capacity per unit length.

For example, in FIGS. 5(a) and 5(b), a method of computing total capacity (Ctotal) per unit length (1 mm) is to convert the corresponding ground capacity Cg into capacity per 1 mm, convert the parallel capacity Cp of the adjacent wiring 2 into capacity per 1 mm, compute crossing number of capacity per 1 mm where the crossing wiring having the same crossing density as that of the above-mentioned model exists (e.g., 4 wires/100 μm×1 mm), and multiply capacity (Cc) per a wire of the crossing wiring 3 by the computed value. Then, by adding the above-mentioned computed values to each other, the total capacity Ctotal per 1 mm is got as following;

$$Ctotal=(Cg/100\ \mu m\times 1\ mm)+(Cp/100\ \mu m\times 1\ mm)+(Cc\times 4/100\ \mu m\times 1\ mm) \quad \text{formula 1.}$$

Figure 6:
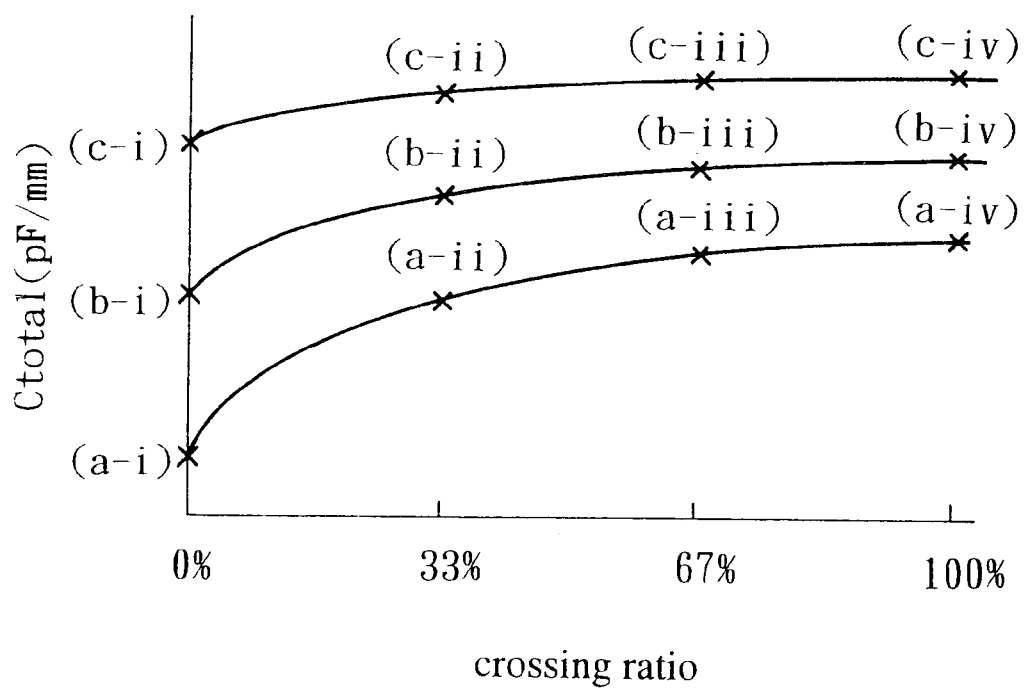
FIG. 6 is a characteristic graph showing the dependency of wiring capacitance of adjacent wiring and crossing wiring.

As a consequence, FIG. 6 (corresponding to the models of FIGS. 3(a) through 3(c) and FIGS. 4(i) through 4(iv)) is a graph showing the total capacity Ctotal per unit length of the models with different numbers of adjacent wiring 2 and different crossing ratios of the upper layer. From FIG. 6, it will be seen that the capacity per unit length has high increment ratio in a low crossing ratio zone, whereas it has low increment ratio in a high crossing ratio zone. Besides, it will be understood that, in case of no adjacent wiring, the capacity per unit length has high increment ratio in comparison with a case where one-side or both-sides adjacent wiring.

Figure 7A:
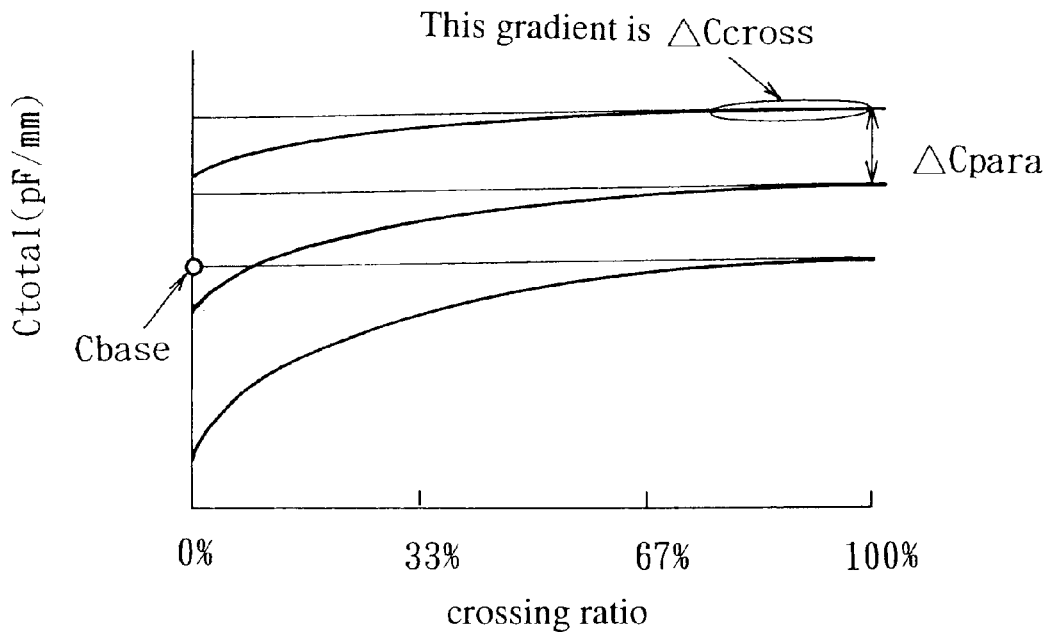
FIG. 7(a) is an explanatory view showing standard capacity value of noted wiring, increment value of the capacity due to parallel wiring, and increment valued of capacity due to crossing wiring.
Figure 7B:
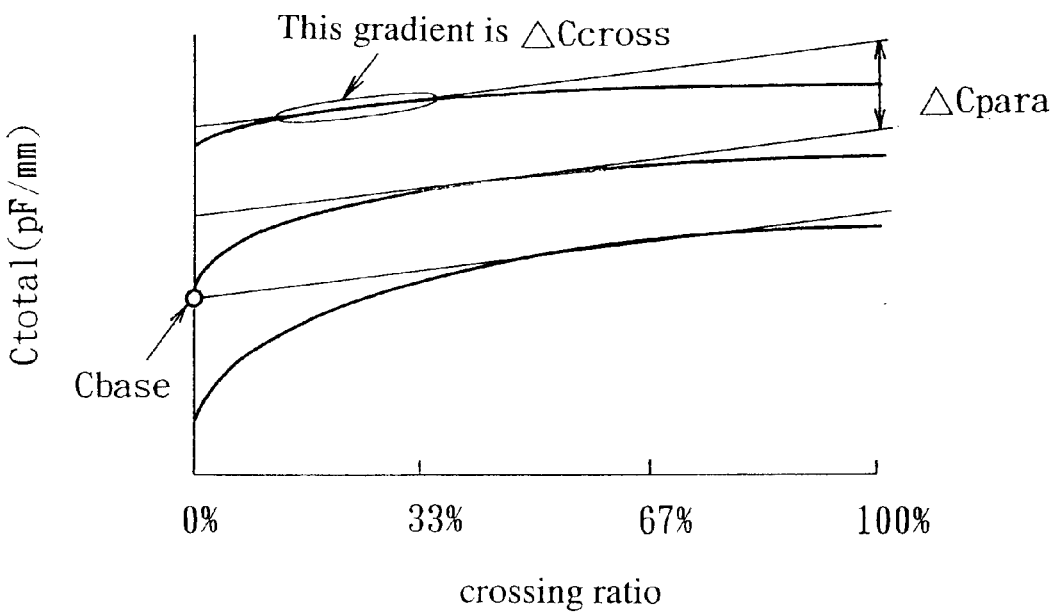
FIG. 7(b) is an explanatory view showing standard capacity value of noted wiring, increment value of the capacity due to parallel wiring, and increment valued of capacity due to crossing wiring.

On the basis of this FIG. 6, the ΔCcross is got from the gradient of the capacity relative to the crossing ratio, the ΔCpara is also determined by the difference between the wiring capacitance value of the one-side and both-sides adjacent wiring, and Cbase can finally be determined by using these values. Referring to FIGS. 7(a) and 7(b), it will be appreciated that these values can vary depending on the selected crossing ratio.

(3) From the netlist, signal length of the noted wiring 1, parallel length of the parallel wiring 2 running in parallel, and wiring length of the crossing wiring 3 (width×wiring number of the crossing wiring) are computed respectively. Generally, the wiring is mostly formed from wiring layers differently running along the X-direction and Y-direction and one of the layers are exchanged for the other by way of vias. Since there is the case where the wiring capacitance is varied depending on the wiring layers, a signal is treated as a plurality of segments separated by vias. Thus, it is a general practice to determine, by segment unit, the signal length, the parallel length of the adjacent wiring running in parallel, and the length of the crossing wiring (width×number of the wires crossing it).

(4) Capacity of each segment is determined by means of formula; (Cbase×segment length)+(ΔCpara×parallel length)+(ΔCcross×crossing wiring length).

Figures 8, 9:
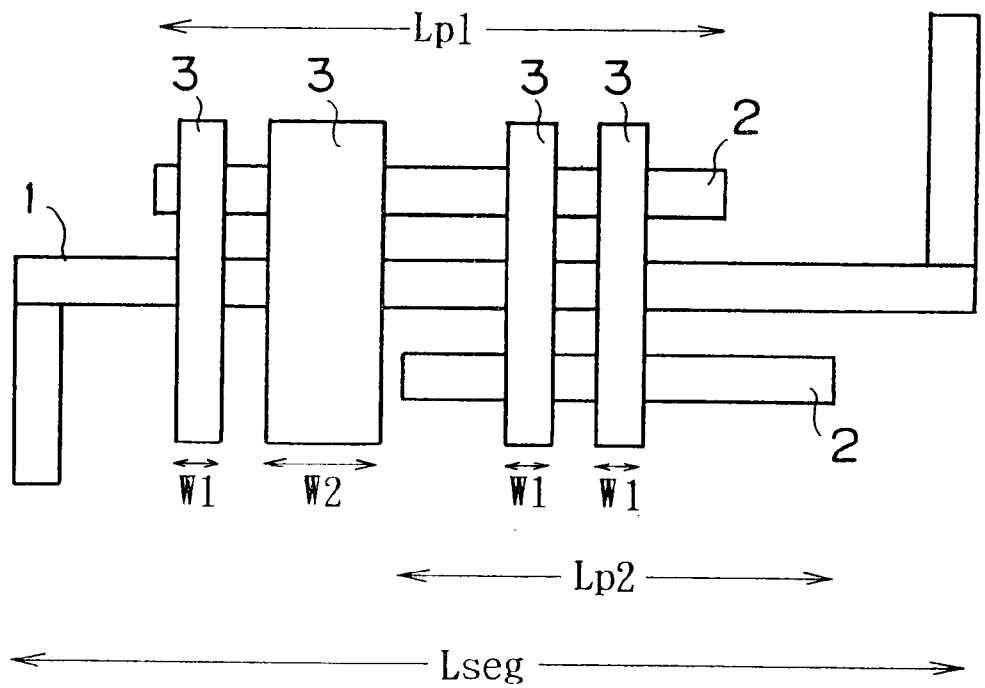
FIG. 8 is an explanatory view showing the computing of segment capacity.
FIG. 9 is a two-dimensional table showing, the rate of parallel ratio to crossing ratio.

For example, the capacity of each segment shown in FIG. 8 is determined by formula below;

$$Cseg = (Cbase \times Lseg/1\text{ mm}) + (\Delta Cp \times (Lp1+Lp2)/1\text{ mm}) + (\Delta Cc \times (W1 \times 3 + W2 \times 1)/1\text{ mm}) \quad \text{formula 2.}$$

(5) A two-dimensional table of a relationship between crossing ratios and numbers of adjacent wiring (parallel ratios) is prepared from the capacity values obtained in the above-mentioned (1) instead of the using of the above-mentioned (2).

For example, as shown in FIG. 9, by taking 0%, 33%, 67%, and 100% of the crossing ratio arranged horizontally and 0% (no adjacent wiring), 100% (one-side adjacent wiring), and 200% (both-sides adjacent wiring) arranged vertically, a table has values of the capacity corresponding to each of crossing and parallel ratio is drawn out.

(6) The length of the noted wiring 1, the parallel wiring length (parallel ratio), and the crossing ratio of the crossing wiring 3 are determined from the netlist. Generally, the wiring is mostly formed from wiring layers differently running along the X-direction and Y-direction and one of the layers are exchanged for the other by way of vias. Since there is the case where the wiring capacitance is varied depending on the wiring layers, a signal is treated as a plurality of segments separated by vias. Thus, it is a general practice to determine, by segment unit, the signal length, the parallel wiring length (parallel ratio), and the crossing ratio.

For example, in the above-mentioned FIG. 8, the parallel ratio, the crossing ratio, and $\alpha$ are defined by formulas 3 through 5 below, respectively;

$$\text{parallel ratio} = (Lp1+Lp2)/Lseg \quad \text{formula 3,}$$

$$\text{crossing ratio} = (W1 \times 3 + W2 \times 1)/Lseg/\alpha \quad \text{formula 4,}$$

and $$\alpha = \text{line width}/(\text{line width} + \text{space width}) \quad \text{formula 5.}$$

(7) A capacity per unit length of the segment is determined on the basis of the parallel and crossing ratio got from the above-mentioned (6), and then segment capacity is computed by multiplying the capacity per unit length of the segment by the length of the segment. Unless being found in the table, the parallel and crossing ratio of the segment are, computed by interpolating the points surrounding the value to be determined. The interpolation may be a linear interpolation or an n-degree formula interpolation.

(8) An approximate expression of the function using the crossing and parallel ratio as two variables is determined from the capacity value obtained in the above-mentioned (1) instead of the above-mentioned (5).

(9) A capacity per unit length of the segment, computed by the approximate expression of the above-mentioned (8), is determined on the basis of the parallel and crossing ratio got from the above-mentioned (6), and then segment capacity is computed by multiplying the capacity per unit length of the segment by the length of the segment.

With the above described techniques for computing the wiring capacitance, a library is formed as a table from the capacity values corresponding to the crossing and parallel ratio cited above, or as the function having two variables of the crossing and parallel ratio. The table or function of this library means data represented by predetermined format. The data are stored in a computer-readable recording medium such as a CD-ROM for use. And, those who design LSIs can use the data stored in the computer-readable recording medium on a design system with a computer to carry out a LSI design.

Therefore, according to the method of computing wiring capacitance prior to the LSI design, by getting several values of the capacity corresponding to the crossing and parallel ratio respectively for the delay computation in the LSIs and then forming the library from these values, the parasitic capacity due to the wiring can be determined at high speed and with great accuracy. Also, the simulation can be made of about twenty per wiring species (wiring layer, width, and/or pitch) in order to prepare the library. As a consequence, since the parasitic capacity is computed with great accuracy, accuracy of computing the signal propagation time can be improved.

Next, referring to FIGS. 10 and 11, a design process will be described by using a method of computing the signal propagation delay due to cross talk. Before this signal propagation delay due to cross talk is computed, a table of fluctuating delay values due to cross talk and a table of function are prepared in advance. The fluctuating delay values are defined to correspond to parallel length and positions of the parallel wiring about ① {wiring layer of wiring running in parallel with the noted wiring, combination of wiring width, and space between the noted wiring and wiring adjacent thereto} or ② {capacity between the noted wiring and wiring adjacent thereto, other capacity (corresponding ground capacity or crossing wiring capacitance in upper and lower layers) of non-noise signal wiring, other capacity of noise source signal wiring, resistance of non-noise signal wiring, and characteristic of resistant value or the like of noise source signal wiring}, respectively.

(11) After wires are arranged and distributed, a wiring form is analyzed by using the prepared netlist (Step S1 and S2). By this analysis of the wiring form, information is gathered about parallel wiring running in parallel with the wiring and upper-lower layer crossing wiring arranged on and/or down the wiring respectively.

(12) The delay factors (R: wire resistance and C: wire capacity) are extracted on the basis of unit cost of the capacity and resistance as registered in the library that is prepared in advance, and outcome of the analysis obtained in the above-mentioned (11) (Step S3).

(13) The fluctuating values of delay ($\Delta tpd$) due to cross talk are computed on the basis of the function table prepared in advance and the information about the parallel wiring obtained in the above-mentioned (11) (Step S4). Then, it is determined if the processing operation for all the net is over or not (Step S5) and, if not, the processing operation from Step S2 to Step S5 is repeated until being completed.

(14) Net is traced by using a flip-flop or a port as starting point. Values of the delay between the flip-flop or port and the gate, and timing of causing fluctuation of the cross talk delay (Step S6 through S8) are computed. That is, the time of operation is determined by using the flip-flop of each gate as starting point.

(15) Regarding each of the parallel wiring, it is determined whether the operation time of each of the source/gate is or not within the timing that affects fluctuation of the delay. A method of performing this determination will be described hereinafter. Here, it is determined if the port of the flip-flop is the final point or not (Step S9) and, if not, the processing operation from Step S7 to Step S9 is repeated until the port of the flip-flop is final point.

(16) The fluctuation value of the delay, due to the cross talk taking the timing into consideration, is added to path delay (Step S10). That is, the path delay is determined by adding to only $\Delta tpd$ depending on the parallel wiring that affects the fluctuation delay.

(17) Value relative to Set-up or the like is added (Step S11). Here, it is determined if all the flip-flops or the ports are or not selected as starting point (Step S12) and, if not, the processing operation from Step S6 to Step S12 is repeated until all the flip-flops or the ports are selected as stating points.

(18) It is determined if all the path delays are or not within an objective value (Step S13) and, if the determination is yes, the processing operation is terminated. If no, the factors causing this situation (delay over) are analyzed (Step S14).

(19) It is determined that the objective value can be achieved by cross-talk delay countermeasures or not (Step S15) and, if the determination is yes, the countermeasures as following are taken to the paths showing fierce fluctuation. For example, the countermeasures are a modification of a wiring form of the noted wiring (a net showing a large Δtpd net), a modification of a form of the adjacent wiring (a noise source net), arrangement of shield wiring between the noted wiring and the adjacent wiring adjacent to the noted wiring, or a shift of the timing by means of an insertion into a gate or the like. This results in reducing a change of the delay due to the cross talk (Step S16). And, step S1 follows after this processing operation.

(20) If the objective value can not be achieved be the cross-talk countermeasures, logical modifications or the like of the LSI design is made additionally (Step S17). And, step S1 follows after achieving the logical modification.

Sequentially, another design process will be described by using a method of computing the signal propagation delay due to cross talk, referring to FIGS. 12 and 13. The design process is the method of extracting objective paths, as compared to FIGS. 10 and 11, to compute fluctuating value of the delay in order to reduce time and trouble required making the LSI design.

Figure 10:
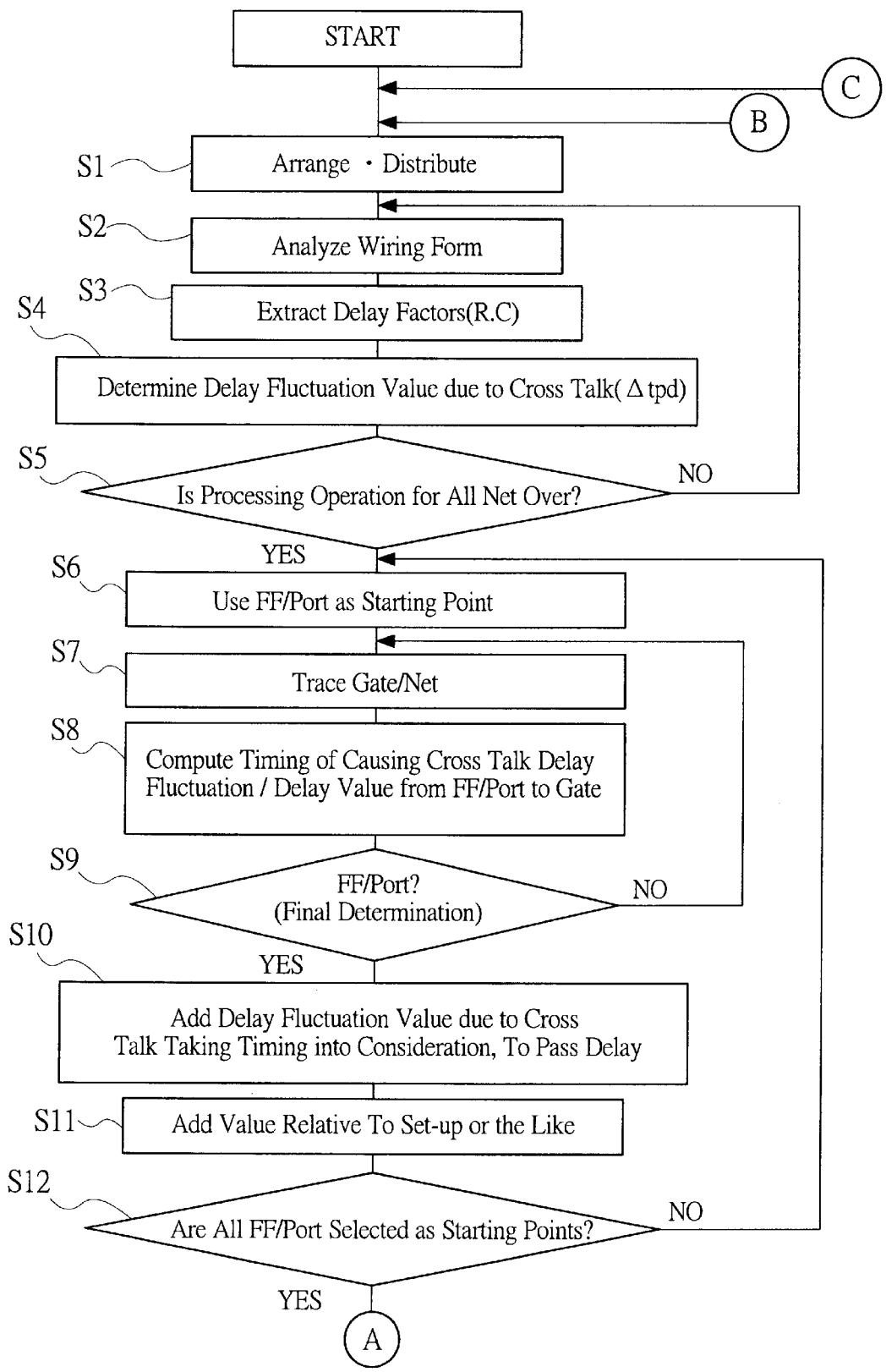
FIG. 10 is a schematic flow chart showing design process order in a method of computing delay due to cross talk of one embodiment of the present invention.
Figure 11:
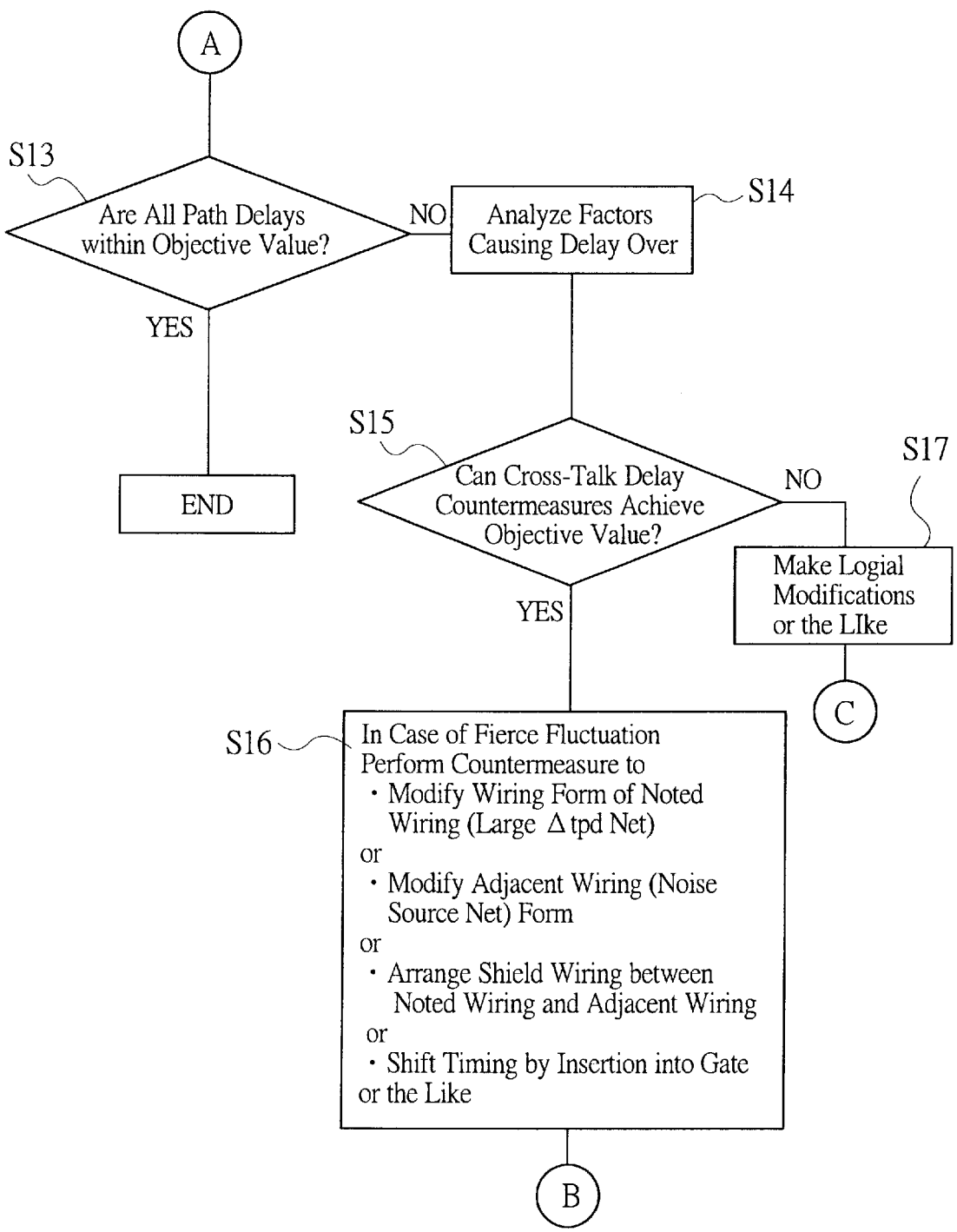
FIG. 11 is a schematic flow chart showing design process following FIG. 10.
Figure 12:
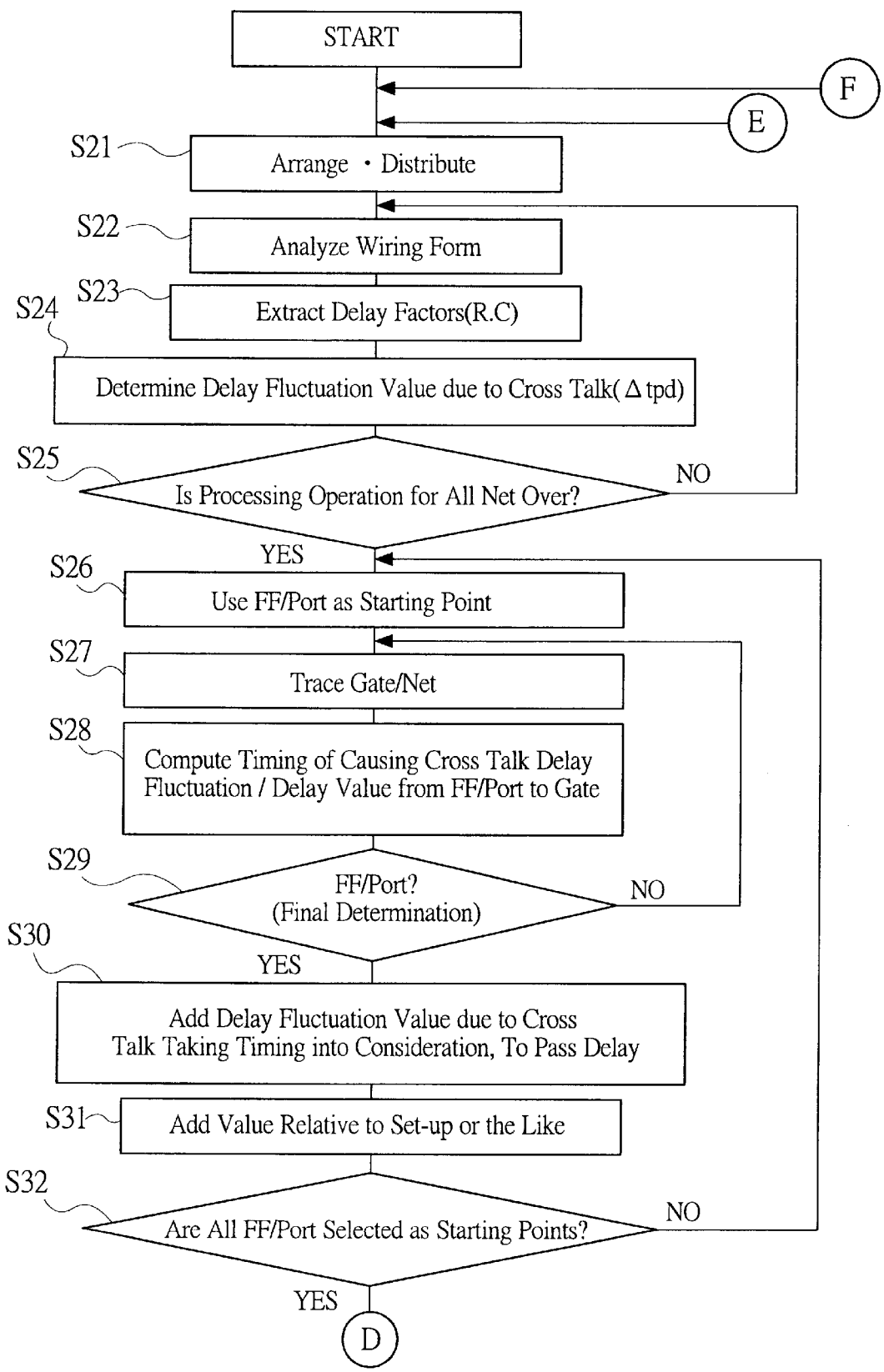
FIG. 12 is a schematic flow chart showing another design process.
Figure 13:
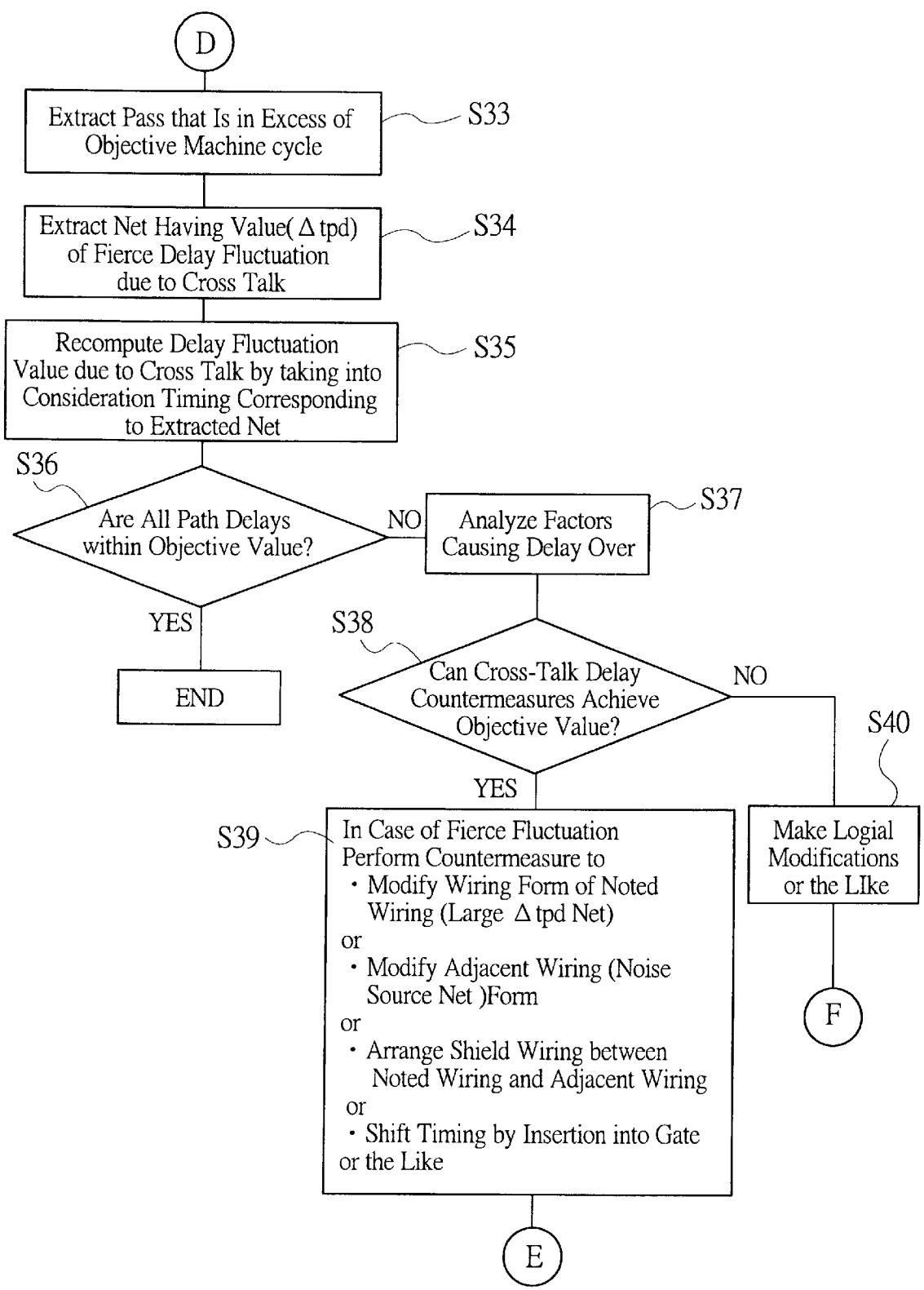
FIG. 13 is a schematic flow chart showing another design process following FIG. 12.

Steps S21 to S29 in FIG. 10 correspond to steps S1 to S9 in FIG. 12, respectively. Steps S31 and S32 in FIG. 12 correspond to steps S11 and S12 in FIG. 10, respectively. Steps S36 to S40 in FIG. 13 correspond to step S13 to S17 in FIG. 11, respectively. And, contents of the processing operation of steps described in FIG. 12 and 13 are equal to that of steps described in FIG. 10 and 11 as mentioned above. Steps different from the above-described steps will be explained below

(21) In step S30, the fluctuation value of the delay due to the cross talk is added to path delay. That is, here, timing is not taken into consideration.

(22) In step S33, any path that is in excess of the objective machine cycle is extracted. And, the net, having a value (Δtpd) of a fierce fluctuation of the delay due to cross talk, are extracted. By means of taking in consideration the timing as corresponding to this extracted net, the fluctuation value of the delay due to cross talk is recomputed (Steps S34 and S35). Thereafter, the process operation stating from step S36 is performed as well.

Subsequently, a method of computing the timing using the method of computing the delay due to cross talk will be discussed below, by referring to FIGS. 14(a) through 14(c). The timing that is affected by the delay due to cross talk is computed below on the basis of a noted net 11, delay at a source gate output point in an adjacent net, rising time tr/falling time, and wiring delay of an noted net side;

$$\{tr(\text{adjacent})/2 + tf(\text{noted})/2\} \leq \{t(a2) - t(v2)\} \leq \{tr(\text{adjacent})/2\} \quad \text{formula 6.}$$

Figure 14A:
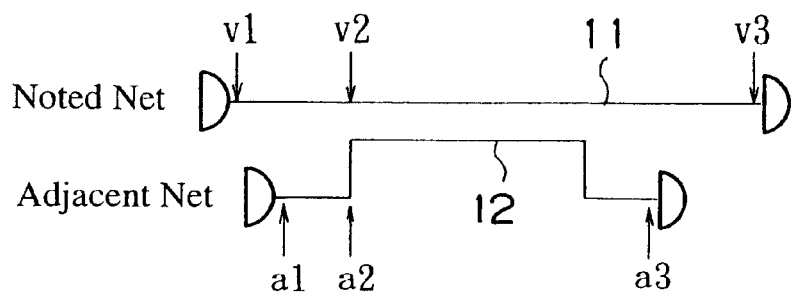
FIG. 14(a) is an explanatory view showing the computing of timing.

In FIG. 14(a), assume that t (node) corresponds to time when respective voltages of the nodes v1, v2 and v3 of the noted net 11 and respective nodes a1, a2 and a3 of the adjacent net 12, cross threshold voltage Vth. However, since a long time and a large volume of memory are required computing the delay of the nodes a2 and v2 in the net, the delay computation is performed below using t(a1), t(v1) and the wiring delay.

Although the time t(v2) of the node v2 of the noted net 11 and the time t(a2) of the node a2 of the adjacent net 12 fluctuate depending on position arranged in parallel, time t(v2) and t(a2) are within the range as shown below;

$$t(v1) \leq t(v2) \leq t(v3) = t(v1) + tpdR(\text{noted}) \quad \text{formula 7}$$

and $$t(a1) \leq t(a2) \leq t(a3) = t(a1) + tpdR(\text{adjacent}) \quad \text{formula 8,}$$

where tpdR represents the wiring delay. However, assume that maxim wiring delay is the tpdR (adjacent) when fanning out $\geq 2$ (a plurality of single gates).

Figure 14B:
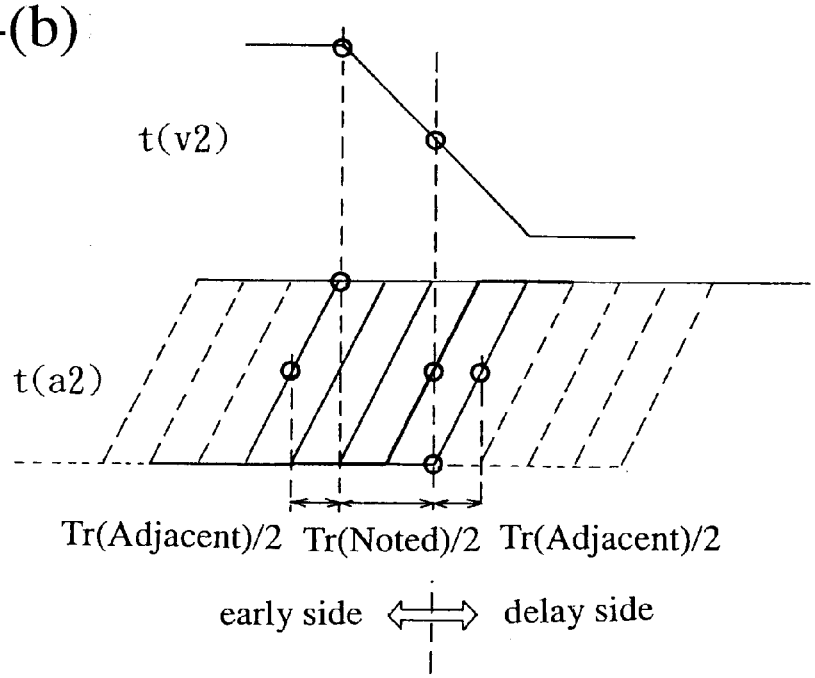
FIG. 14(b) is an explanatory view showing the computing of timing.

The range for (t(a1)–t(v1)) which affects the delay at the side of the noted net 11 is found from the formulas 7 and 8 on the basis of FIG. 14(b) as following;

$$\{tr(\text{adjacent})/2 + tf(\text{adjacent})/2 + tpdR(\text{adjacent})\} \leq \{t(a1) - t(v1)\} \leq \{tr(\text{adjacent})/2 + tpdR(\text{noted})\} \quad \text{formula 9.}$$

A description may be made by using coefficients ($\alpha$, $\beta$, $\gamma$, $\delta$) as following;
At as early side, $$\{\alpha \times tf(\text{noted}) + \beta \times tr(\text{adjacent}) + \gamma \times tpdR(\text{noted}) + \delta \times tpdR(\text{adjacent})\} \leq \{t(a1) - t(v1)\} \quad \text{formula 10,}$$

and at a delay side, $$\{t(a1) - t(v1)\} \leq \{\alpha \times tf(\text{noted}) + \beta \times tr(\text{adjacent}) + \gamma \times tpdR(\text{noted}) + \delta \times tpdR(\text{adjacent})\} \quad \text{formula 11,}$$

where the coefficients ($\alpha$, $\beta$, $\gamma$, $\delta$) can define respective values for the early side/delaying side and for the MAX delay computation/MIN delay computation.

The combination of tr/tf (signal rising time/signal falling time) is, when the MAX delay is computed, such that rising of the adjacent net 12 corresponds to falling of the net 11, and falling of the adjacent net 12 correspond to rinsing of the net 11. The combination is, when the MIN delay is computed, such that the falling of the adjacent net 12 corresponds to the falling of the noted net 11, and the rinsing of the adjacent net 12 corresponds to the rising of the noted net 11.

Each range computed by the formulas 10 and 11 is defined as NG range. If determining criterion described below determine that the adjacent net 12 is NG, only irregular distribution of the cross talk delay caused by the NG adjacent net 12 is added. If the determining criterion determine that the adjacent net 12 is OK, irregular distribution of the cross talk delay caused by the OK adjacent net 12 is not added.

Figure 14C:
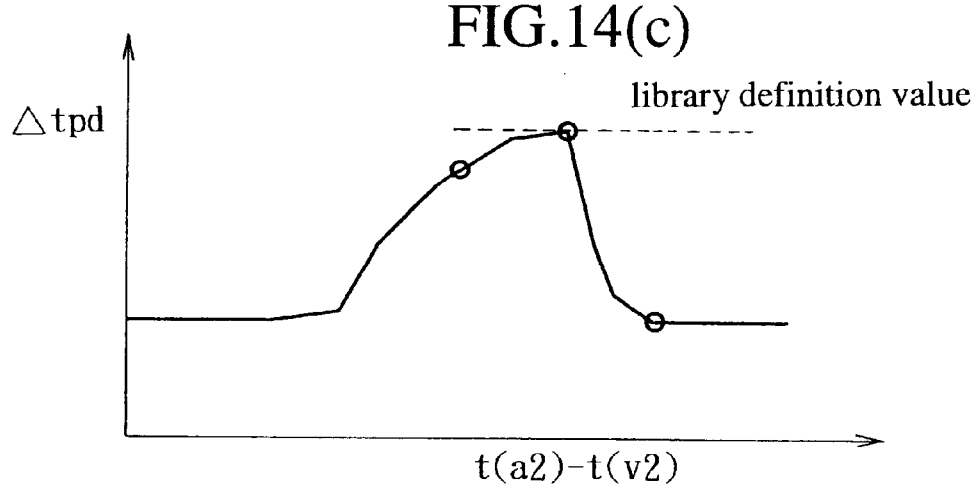
FIG. 14(c) is an explanatory view showing the computing of timing.

As modification to the above method, it is also possible to define a table or a function (corresponding to FIG. 14(c)) of Δtpd relative to $\{t(a2) - t(v2)\}$ instead of a judgement of 0/1 for NG/OK.

Next, the method of determining the timing will be described using the method of computing a cross talk delay by referring to FIG. 15. There exist a plurality of paths for arriving from a flip-flop selected as a starting point to the noted/adjacent net and the time of operation of each net differs in the selected path. Therefore, a path through which a signal earliest reaches the noted/adjacent net from the flip-flop is defined as MIN PATH and a path through which a signal latest reaches the noted/adjacent is defined as MAX PATH.

Figure 15:
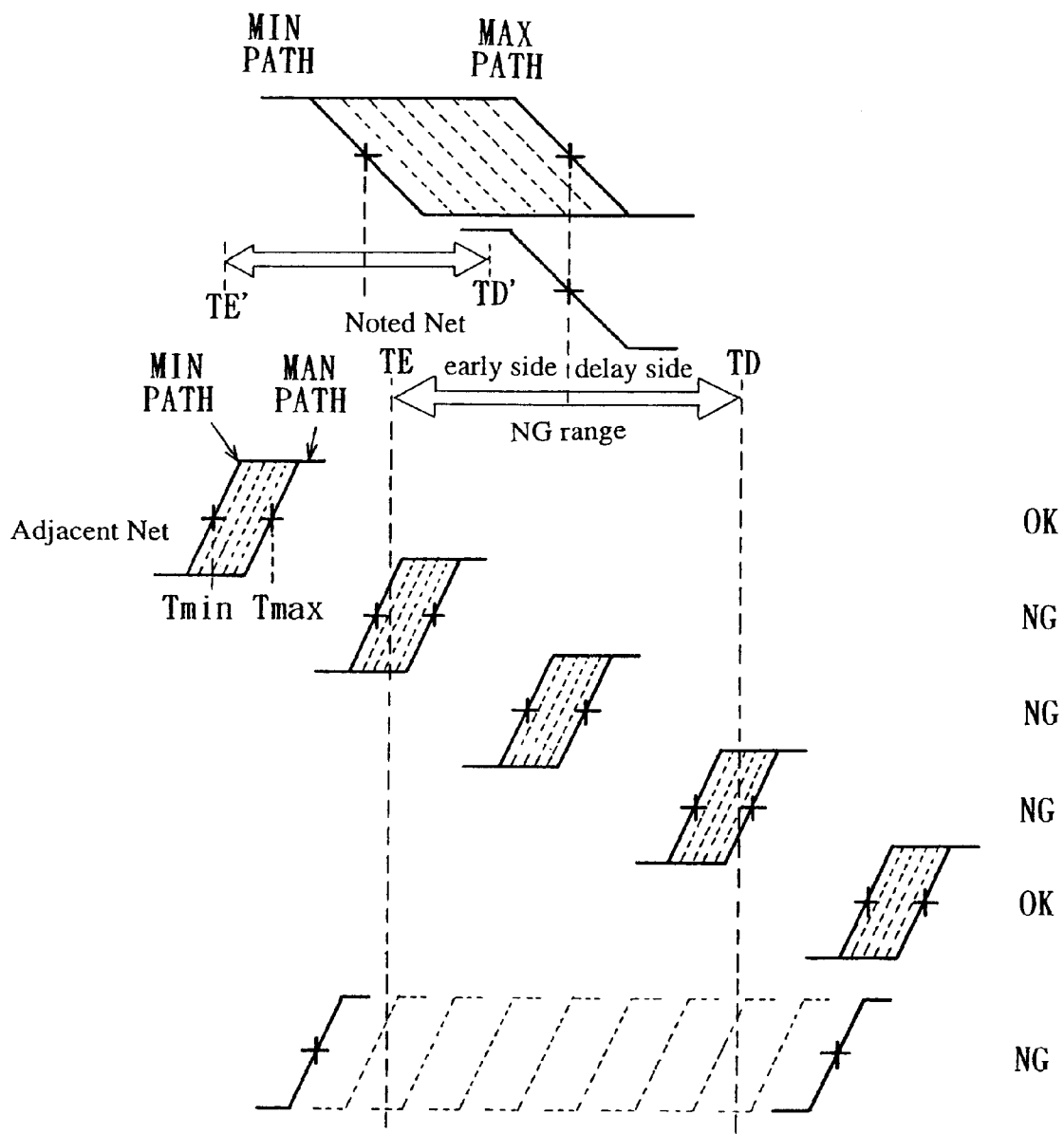
FIG. 15 is an explanatory view showing the determination of timing.

Referring to FIG. 15, when the computing of the MAX delay is performed as taking the MAX PATH of the noted net 11 into consideration, a range between the timing TE of the early side and the timing TD of the delaying side is taken for NG. Therefore, in the case where the adjacent net 12 has the timing Tmax and Tmin corresponding to the MAX PATH and MIN PATH, respectively, the determining criterion determine NG when relationship of $$T\max \geq TE \text{ AND } T\min \leq TD \qquad \text{formula 12}$$

is met and OK when other relationships different from the above-mentioned relationship are met.

That is, as for the timings of Tmin and Tmax of adjacent net 12, the adjacent net 12 is decided to be OK if having both Tmin and Tmax located within a left area of the early side of the noted net 11 or within a right area of the delay side of the noted net 11. The adjacent net 12 is decided to be NG if having either the Tmin or the Tmax, or both between the timing TE and TD. And, the adjacent net 12 is decided to be NG if having the Tmin located within a left area of the timing TE of the noted net 11 and the Tmax located within a right area of the timing TD.

On the other hand, when the computing of the MIN delay is performed as taking the MIN PATH of the noted net 11 into consideration, a range of NG is within a left area at the early side of the timing TE' and/or a right area at the delay side of the timing TD'. The following description made hereinafter is the same as the above-mentioned one of MAX delay.

As described above, regarding the method of computing the signal propagation delay due to cross talk according to the invention, the library is formed by the fluctuating values of the delay and/or the various design parameters combined with respective characteristics different in the wiring layer of the wiring running in parallel, the wiring width, and the space between the wiring and the wiring. This delay fluctuating value and the like after the library is formed, is stored in a computer-readable recording medium represented in the same predetermined format as the above-mentioned one. The design of LSI can be implemented by using the data stored in the recording medium.

Thus, regarding the method of computing the signal propagation delay due to cross talk according to the invention, only the cross talk that can actually give rise to the delay fluctuations are taken into consideration when the computing of the delay is performed in the LSI. Therefore, the surplus margin is eliminated when the delay is predicted. In other words, generation of the delay fluctuation defined by the function table is limited in the case where the signal of the affected side is operated within a predetermined period containing time before and after the signal of the generated side is operated. Therefore, any influences made of signals on the affected side signal operated outside the predetermined period do not need to be taken into consideration. Since only noises that really affect the delay fluctuation are taken into consideration, the delay fluctuation of the present invention is more stable than that of the conventional art in value and, the margin is reduced. As a result, the LSI designed by using the method of the present invention shows that a performance (operating speed) is improved and a power consumption level is reduced.

While being described above in detail by way of preferred embodiments, the present invention is by no means limited to the above described embodiments, which may be altered and modified without departing from the scope of the invention.

For instance, regarding the above-mentioned method of computing the wiring capacitance, in case where the adjacent wiring is different in length, it is possible that the ΔCp rate is used to convert the parallel ratio, and also that as the capacity based on the upper-lower crossing wiring has a separated table, each value of the capacity is totaled finally.

On the other hand, regarding the above-mentioned method of computing the delay due to cross talk, the noted and adjacent wiring requiring modification can be striking represented in a layout tool. And, on such a state that other wiring information except the noted and adjacent wiring requiring modification is frozen, re-wiring can also be automatically performed.

What is claimed is:

1. A method of computing signal propagation delay due to cross talk, said method comprising:

a step of determining range affected by fluctuation of said delay produced by operating time and cross talk noise of noted net;

a step of determining, as a noise source, parallel net overlapping said range affected by fluctuation of said delay to get operating time of signal of other nets running in parallel with one of same layer and upper-lower layer of said wiring of noted net;

step of determining a value of fluctuation of said delay from a table about values of fluctuation of said delay depending on cross talk prepared in advance regarding a combination of said noted net and net of said noise source; and a step of adding, to value of said delay of said noted net, value of fluctuation of said delay depending on said noise source, wherein a noise source signal is determined so as to operate within such a range that fluctuation of said delay depending on said cross talk noise is generated, a value of said delay is determined by means of taking into consideration only fluctuation of cross talk delay depending on said noise source signal.

2. A method according to claim 1, wherein if a countermeasure allows a value of said delay about wiring of said noted net adding a value of fluctuation of net of said noise source, to attain an objective value, fluctuation of delay depending on said cross talk is prevented from occurring by means of at least one of modifications of wiring form about wiring of said noted net, modifications of form about net of said noise source, arrangement of shield wiring between wiring of said noted net and net of said noise source, and an insertion into gate to move outside range affected by fluctuation of said delay.

3. A computer-readable recording medium storing data for said method of computing wiring capacitance according to claim 1, wherein a library is formed from one of {combinations of a wiring layer and width between wiring of said noted net and wiring of other nets running in parallel therewith, and spaces between wiring and other wiring}, {combination of respective characteristics of wiring capacitance between wiring and other wiring running in parallel therewith, other capacity of non-noise signal wiring, other capacity of noise source signal wiring, resistance of non-noise signal wiring, and resistance of noise source signal source}, {location and parallel distance of parallel wiring}, and {combination of source impedance of both nets} in a table about value of fluctuation of said delay depending on said cross talk, and said data, representing said table in said library in a predetermined format, are stored.

* * * * *